(12) United States Patent
Chen et al.

(10) Patent No.: US 11,810,976 B2
(45) Date of Patent: Nov. 7, 2023

(54) SEMICONDUCTOR DEVICE

(71) Applicant: SEMICONDUCTOR COMPONENTS INDUSTRIES, LLC, Phoenix, AZ (US)

(72) Inventors: Weize Chen, Phoenix, AZ (US); Mark Griswold, Gilbert, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 123 days.

(21) Appl. No.: 17/178,729

(22) Filed: Feb. 18, 2021

(65) Prior Publication Data
US 2022/0262949 A1    Aug. 18, 2022

(51) Int. Cl.
*H01L 29/78* (2006.01)
*H01L 29/06* (2006.01)
(Continued)

(52) U.S. Cl.
CPC ........ *H01L 29/7824* (2013.01); *H01L 21/761* (2013.01); *H01L 29/063* (2013.01);
(Continued)

(58) Field of Classification Search
CPC ..... H01L 27/088–0928; H01L 29/0692; H01L 29/0696; H01L 29/1029; H01L 29/1083; H01L 29/1095; H01L 29/42312; H01L 29/42316; H01L 29/4232; H01L 29/768; H01L 29/7801; H01L 29/7816–7826; H01L 29/7835; H01L 29/7836; H01L 29/66674; H01L 29/66681–66704; H01L 29/0623; H01L 29/0646; H01L 29/0642; H01L 29/0653; H01L 29/0843; H01L 29/0852; H01L 29/0882; H01L 29/0865; H01L 29/0878; H01L 29/063; H01L 29/0649; H01L 29/0847; H01L 29/1041; H01L 29/66659; H01L 29/0634; H01L 29/7824; H01L 21/823493; H01L 21/762; H01L 21/823412; H01L 21/823481;
(Continued)

(56) References Cited

U.S. PATENT DOCUMENTS 5,841,170 A    11/1998  Adan et al.
6,097,063 A    8/2000   Fujihira
(Continued)

FOREIGN PATENT DOCUMENTS

CN    105206675 A  * 12/2015  ......... H01L 29/0634

OTHER PUBLICATIONS

Duan et al., NLDMOSS device and manufacturing method thereof, Dec. 30, 2015, machine translation of CN 105206675 A, pp. 1-5. (Year: 2015).*
(Continued)

*Primary Examiner* — Natalia A Gondarenko
(74) *Attorney, Agent, or Firm* — Robert F. Hightower (57) ABSTRACT

In one embodiment, a transistor has a drift region that is formed to have a plurality of zones having different vertical doping profiles across the zones. At least one of the zones has a vertical doping profile that has a first peak near a top surface of the zone and a second peak near a bottom surface. An embodiment may have a lower doping in a region that is between the two peaks.

20 Claims, 4 Drawing Sheets

(51) Int. Cl.
*H01L 29/66* (2006.01)
*H01L 29/10* (2006.01)
*H01L 21/761* (2006.01)

(52) U.S. Cl.
CPC ...... *H01L 29/0649* (2013.01); *H01L 29/1095* (2013.01); *H01L 29/66681* (2013.01)

(58) Field of Classification Search
CPC ........... H01L 21/823892; H01L 21/761; H01L 2924/1306; H01L 2924/13063
USPC ........ 257/339, 327, 335, 355, 343, 213, 288
See application file for complete search history.

(56) References Cited

U.S. PATENT DOCUMENTS

| | | | |
|---|---|---|---|
| 6,894,348 B2* | 5/2005 | Terashima | H01L 29/7816 257/E29.045 |
| 2003/0040160 A1 | 2/2003 | Huang et al. | |
| 2006/0145250 A1 | 7/2006 | Ma | |
| 2006/0220120 A1 | 10/2006 | Horch | |
| 2011/0215402 A1 | 9/2011 | Lee | |
| 2011/0233670 A1 | 9/2011 | French et al. | |
| 2011/0233672 A1* | 9/2011 | Chang | H01L 29/66659 257/E29.256 |
| 2011/0309442 A1* | 12/2011 | Grote | H01L 29/7816 438/286 |
| 2012/0267717 A1 | 10/2012 | Toren et al. | |
| 2015/0179793 A1* | 6/2015 | Denison | H01L 29/66681 438/286 |
| 2016/0104796 A1* | 4/2016 | Yao | H01L 29/402 438/286 |
| 2017/0213894 A1 | 7/2017 | Mallikarjunaswamy | |
| 2018/0151723 A1 | 5/2018 | Grote et al. | |

OTHER PUBLICATIONS

Abouelatta-Ebrahim M et al., Design considerations of high voltage RESURF nLDMOS: An analytical and numerical study, Ain Shams Eng J (2015), http://dx.doi.org/10.1016/j.asej.2014.12.003, 9 pages.

* cited by examiner

SEMICONDUCTOR DEVICE

BACKGROUND

The present invention relates, in general, to electronics, and more particularly, to semiconductors, structures thereof, and methods of forming semiconductor devices.

In the past, the semiconductor industry utilized various methods and structures to form high voltage transistors that had a high breakdown voltage. The high voltage transistors typically had to withstand drain-to-source voltages that were approximately two hundred volts (200V) or greater. It was also desirable that the high voltage transistor had a low on-resistance (Rdson). Typically, the transistor was formed with various doped regions to achieve the desired operation. In order to provide both of these operating parameters the manufacturing process often had to utilize a large number of different processing steps.

In some operations, the large number large number of processing steps increased the cost of the high voltage transistor.

Accordingly, it is desirable to have a high voltage transistor with different doped regions in order to provide both the high breakdown voltage and the low on-resistance, or to reduce the cost.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of a transistor such as an MOS transistor or a high electron mobility transistor (HEMI), or an emitter or a collector of a bipolar transistor, or a cathode or anode of a diode, and a control element or control electrode means an element of the device that controls current through the device such as a gate of an MOS transistor, a gate of a HEMI, or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, or certain N-type or P-type high electron mobility (HEM) devices or certain HEM transistors (HEMTs), a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. For HEM devices, the conductivity type refers to the two dimensional gas type such as a two dimensional electron gas (2 DEG) or a two dimensional hole gas (2DHG). It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for some elements including semiconductor doping concentrations) are reasonable variances from the ideal goal of exactly as described. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

In addition, the description illustrates a cellular design (where the body regions are a plurality of separate cellular regions) instead of a single body design (where the body region is comprised of a single region formed in an elongated pattern, in some embodiments in a serpentine pattern). However, it is intended that the description is applicable to both a cellular implementation and a single base implementation.

The embodiments illustrated and described hereinafter may have embodiments and/or may be practiced in the absence of any element which is not specifically disclosed herein.

DETAILED DESCRIPTION OF THE DRAWINGS

Figure 1:
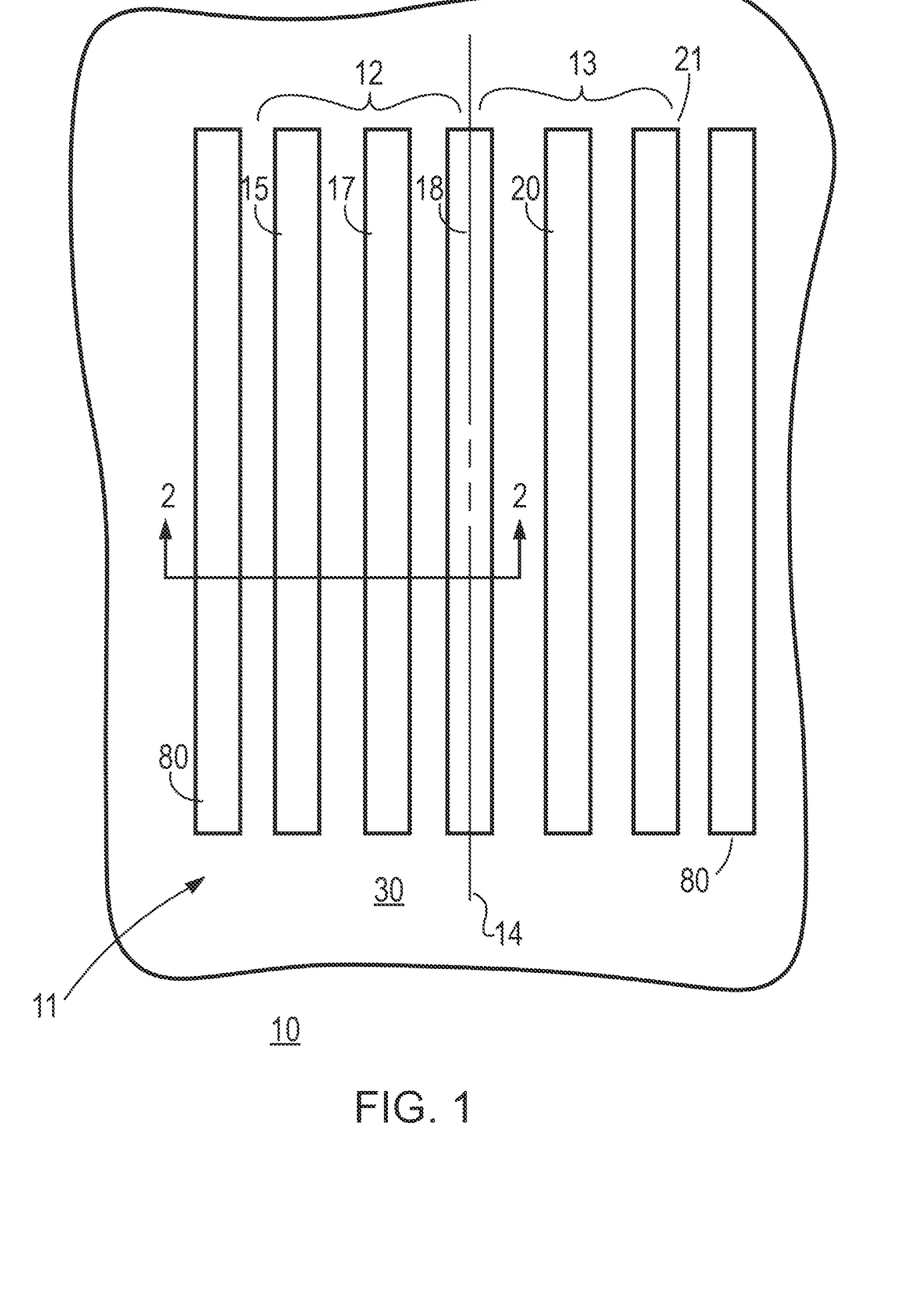
FIG. 1 illustrates an enlarged plan view of a portion of a simplified example of an embodiment of a semiconductor device that includes a high voltage transistor in accordance with the present invention.

FIG. 1 illustrates an enlarged plan view of a portion of a simplified example of an embodiment of a semiconductor device 10 that includes a high voltage transistor 11. Device 10 may, in some embodiments, include other electrical devices or structures that are not illustrated in FIG. 1. In an embodiment, transistor 11 may be formed as a plurality of transistor fingers or transistor elements, such as transistor elements 12 and 13, that each function as a transistor. The plurality of elements are interconnected to function as one transistor. For example, transistor element 12 may include a source region having a source electrode 15 that is formed adjacent to a gate region that has a gate electrode 17 which is spaced apart from a drain region having a drain electrode 18. The drain region and drain electrode 18 may be shared commonly between elements 12 and 13. Element 13 may also include a gate region having a gate electrode 20 and a source region having a source electrode 21. In some embodiments, source electrode 21 may be similar to source electrode 15 and gate electrode 20 may be similar to gate electrode 17.

An axial centerline 14 represents the center of elements 12 and 13 such that transistor 11 may be substantially symmetrical around line 14. Those skilled in the art will appreciate that although transistor 11 is illustrated with two elements 12 and 13, transistor 11 may be formed to have many numbers of elements such as element 12 and 13. Isolation regions or isolation structures 80 may be formed to isolate transistor 11 from other portions of device 10.

Figure 2:
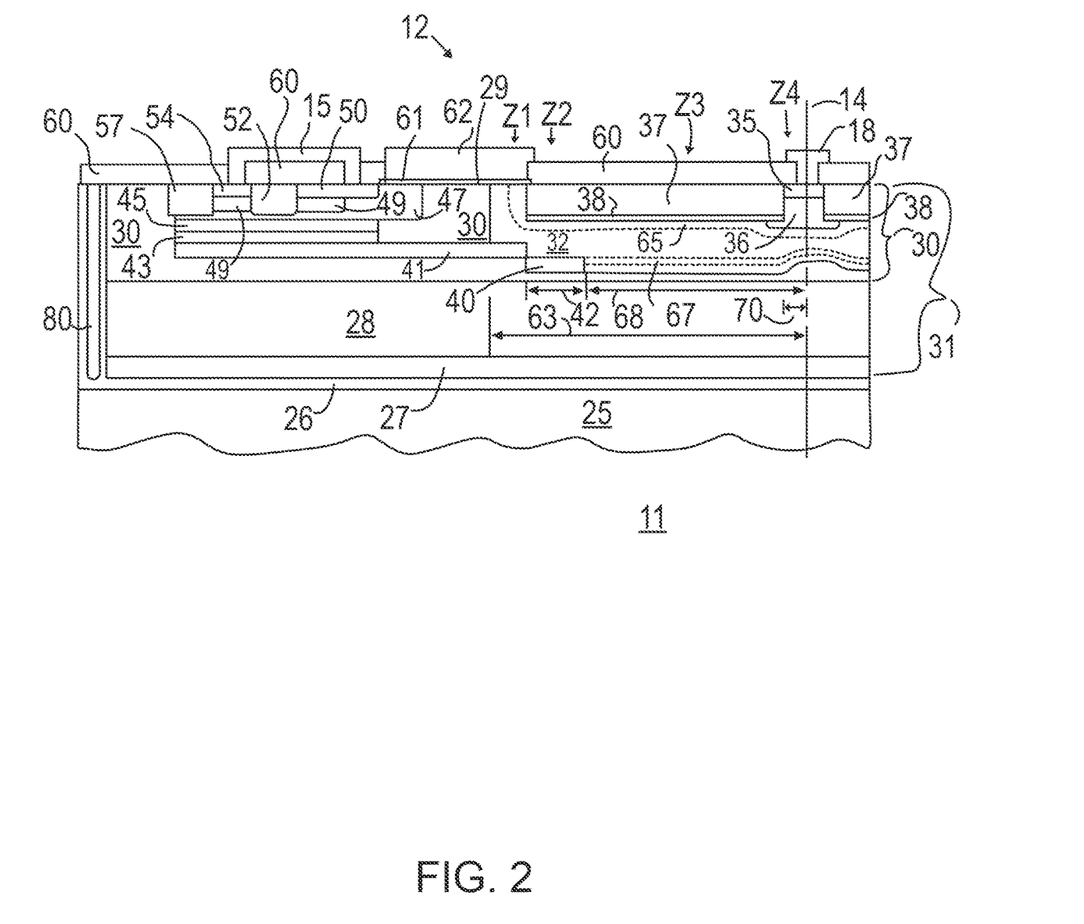
FIG. 2 illustrates an enlarged cross-sectional portion of an example of an embodiment of the of FIG. 1 in accordance with the present invention.

FIG. 2 illustrates an enlarged cross-sectional portion of an example of an embodiment of transistor 11 along cross-section line 2-2 of FIG. 1. Transistor 11 may be formed on a semiconductor substrate 25. An embodiment may also include that an insulator layer or insulator 26 may be formed on substrate 25 to provide electrical isolation between substrate 25 and elements of transistor 11. Insulator 26 may be formed from silicon dioxide or silicon nitride or other insulator materials that are well known to those skilled in the semiconductor art. In another embodiment, layer 26 may be omitted.

A doped region or doped layer 31 may be formed on insulator 26. Layer 31 may be formed by epitaxial techniques or by doping a portion of another region formed on insulator 26. Layer 31 may be formed to include an optional anti-back gate layer 27 that may be formed on insulator 26. Forming layer 31 may also include forming a doped bottom layer 28 on layer 27, or alternately on insulator 26, and forming a doped upper layer 30 on layer 28 as a portion of layer 31. In an embodiment, layers 27, 28, and 30 may be formed to have a P-type conductivity.

Isolation structure 80 may be formed as a deep trench isolation structure that extends from the surface of layer 31 a distance into layer 31 to intersect with insulator 26. Those skilled in the art will appreciate that structure 80 may be formed by creating a trench opening into layer 31 and forming an insulating material along the sidewalls of the trench opening. Thereafter, any openings in the insulating material may be filled with other material, such as for example polysilicon. Structure 80 and insulator 26 form an isolation structure that isolates transistor 11 from any other portions of device 10 (FIG. 1).

Transistor 11 also includes a source region 50. In some embodiments, source region 50 may include a source contact region and an adjacent and/or underlying source doped region that may, in some embodiments, have a lighter active dopant concentration than the source contact region. A body region 49 may be formed as a doped region underlying and intersecting source region 50. Body region 49 may include a body contact region 54 that facilitates forming a low resistance contact to body region 49. A portion of layer 30 that is laterally adjacent to region 50 may be doped to a greater active dopant concentration than layer 30 in order to form a doped region 47. Region 47 may have an embodiment with portions that extend laterally to intersect body region 49. Region 49 may, in some embodiments, assist in increasing the safe operating area (SOA) of transistor 11. In an embodiment, a portion of region 47 may be formed to underlie region 49 and extend to underlie body contact region 54. For example, region 49 may be formed within region 47, and region 50 may be formed within region 47. An embodiment of transistor 11 may include that region 50 may be formed to have an N-type conductivity, and regions 47, 49 and 54 may be formed to have a P-type conductivity.

Transistor 11 also includes a drift region 32 that has a width that extends laterally a distance 63 across layer 30 away from the center of the drain region, or alternately from axial line 14, toward region 47. Because the drain region of transistor 11 may be shared with elements 12 and 13, another and substantially similar portion of region 32 may also extend in the opposite direction from line 14 to assist in forming element 13 (FIG. 1). In some embodiments, a portion of layer 30 may be positioned laterally between region 47 and region 32.

Drift region 32 may be formed as a doped region that extends from the surface of layer 30 a distance into layer 30. Region 32 may have an embodiment that does not intersect or extend into layer 28.

As will be seen further hereinafter, region 32 has a plurality of carrier charge zones or zones that have a carrier charge concentration or active dopant profiles that vary from zone to zone across the width or distance 63 of region 32. The carrier charge concentration or charge refers to the number of majority carriers that are available to form current flow through region 32 to the drain of transistor 11. An embodiment of transistor 11 may include four (4) carrier charge zones or zones (Z1-Z4), but may have more or fewer zones in other embodiments. A carrier adjustment region is formed as a doped region 40 that may assist in forming a portion of the zones for region 32 (for example zone Z2), and another carrier adjustment region may be formed as a doped region 41 that may assist in forming another portion of the zones for region 32, for example zone Z1. Regions 40 and 41 may have an opposite conductivity type to region 32, for example a P-type conductivity.

An optional doped region 38 may be formed along the top portion of region 32 and with an opposite conductivity type to region 32, for example a P-type conductivity. Region 38 may assist in reducing electric fields at the surface of region 32.

An insulator 37 may be formed in layer 30 and overlying region 38 and a portion of region 32. Insulator 37 may assist in reducing leakage currents between elements of transistor 11. In some embodiments, insulator 37 may be a notch in region 32 that may be formed by shallow trench isolation techniques using insulator materials that are well known to those skilled in the art.

A gate structure may be formed overlying a portion of region 47 and overlying a portion of layer 30 that is positioned laterally between regions 47 and 32. The gate structure may include a gate insulator 61 that is formed overlying a portion of region 47 that is adjacent to region 50, and overlying the portion of layer 30 that is between region 32 and region 47. Those skilled in the art will appreciate that insulator 61 is much thinner than insulator 37 and insulator 26. A gate conductor 62 may be formed on insulator 61. Conductor 62 may be formed overlying the portion of region 47 that is laterally adjacent to region 50 and overlying the portion of layer 30 that is between regions 32 and 47. Region 47 and the portion of layer 30 underlying conductor 62 form the channel region of transistor 11. An embodiment of insulator 61 and conductor 62 may also be formed to overlie a portion of region 32 that is adjacent to layer 30. Insulator 61 and conductor 62 may be formed from a variety of well-known respective insulator materials and gate conductor materials. Conductor 62 may be connected to electrode 17.

The drain region of transistor 11 may be a portion of region 32 that underlies a drain contact or contact region 35. Drain contact 35 may be a doped region that has a high active dopant concentration in order to facilitate forming a low resistance electrical connection to the drain region. For example, a low resistance connection between drain electrode 18 and region 32. An optional doped region 36 may be formed underlying drain contact 35 and extending vertically into region 32. For example, region 36 may be formed within region 32 and region 35 may be formed within region 36, or alternately within region 32. Regions 32, 36, and 35 may be formed to have an N-type conductivity. Region 36 may have an active doping concentration that is less than region 35 and greater than region 32. Region 36 may assist in reducing charge crowding at the drain of transistor 11 thereby improving the on-resistance.

Figure 3:
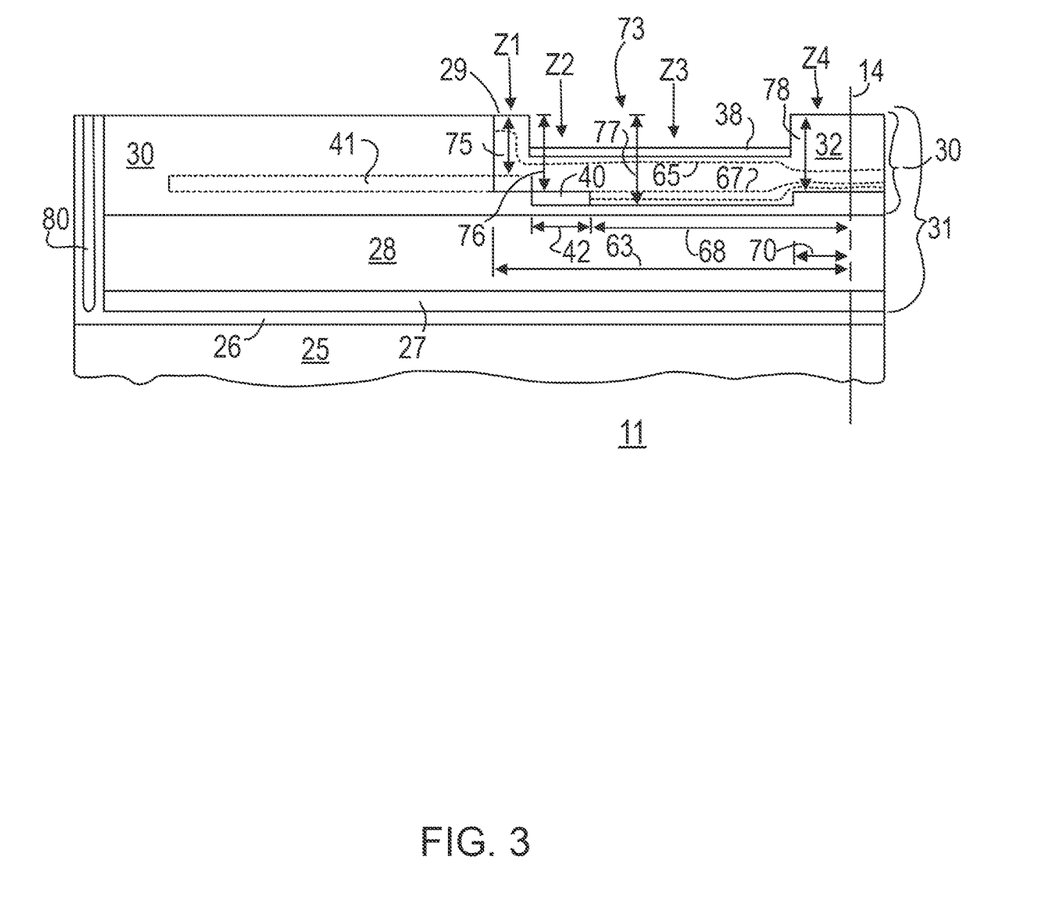
FIG. 3 illustrates an enlarged cross-sectional view of an example of an embodiment of the transistor of FIG. 2 at a stage of an example of an embodiment of a method of forming the transistor in accordance with the present invention.

FIG. 3 illustrates an enlarged cross-sectional view of an example of an embodiment of transistor 11 at a stage of an example of an embodiment of a method of forming transistor 11. As will be seen further hereinafter, region 32 is formed to include the plurality of zones. An embodiment of region 32 may be formed to include the four zones Z1-Z4. In an embodiment, each zone is a vertical slice of region 32 that may be formed to have a vertical doping profile that varies over the depth of the zone and that remains substantially constant across the lateral distance or width of the particular zone, or alternately may be formed to have a substantially constant dopant concentration laterally across the zone, for example across a plane through the particular zone. Each zone may have an embodiment that has a width that is no less than approximately ten percent (10%) of distance 63. An embodiment may include that the vertical doping profile may be formed to have an abrupt or step change between each adjacent zone. Each zone may have an embodiment that includes a charge concentration for the zone. The charge concentration may be substantially constant laterally across the zone (for example along a horizontal plane through the zone), and there may be substantially a step change in the charge concentration between two adjacent zones.

Prior to forming regions 32, 40, and 41, an opening 73 may be formed from a surface 29 of layer 30 into layer 30. An embodiment may include that opening 73 may be formed prior to forming regions 43, 45, 47, 49, 50, and 54. Opening 73 may be a notch formed by applying a mask and removing a portion of the material of layer 30 to a depth that allows for forming insulator 37. Opening 73 has a width or lateral distance across layer 30 that is less than distance 63. Opening 73 may have an embodiment having a depth of approximately two tenths to approximately five tenths (0.2-0.5) of a micron into layer 30.

Thereafter, layer 30 may be doped to form region 32. For example, the first mask may be removed and another mask may be applied to expose the position where region 32 is to be formed and then layer 30 may be doped. Because of opening 73, the dopants extend to different depths into different portions of region 32. A middle portion of region 32 underlies opening 73. An outer portion and a central portion of region 32 are adjacent to opposite sides of opening 73. The central portion underlies drain contact 35 (FIG. 2) or alternately is substantially coaxially to line 14. The central portion has a distance 70 from line 14. The outer portion is adjacent to a side of opening 73 and extends laterally from the edge of opening 73 toward source region 50 or alternately from the middle portion of region 32 toward source region 50 (FIG. 2). An example may include that the outer portion includes at least one zone such as zone Z1, the central portion includes at least one zone such as zone Z4, and the middle portion includes at least one zone such as one or more of zones Z2 and Z3.

Dopants in the middle portion underlying opening 73 extend further from surface 29 into layer 30 than those in the outer portion and the central portion. During the formation of region 32, the active dopant concentrations are varied at different depths from surface 29, thus, from the top of opening 73. External to opening 73, a depth may be measured from surface 29, and underlying opening 73 a depth may be measured from the top of opening 73. An embodiment of region 32 is formed to include three lateral doped regions across distance 63 that have different active dopant concentrations. The first region is a doped region 65 (illustrated by a dashed line). Region 65 is formed to extend laterally across distance 63. In the middle portion underlying opening 73, region 65 is positioned vertically near the bottom surface of opening 73 at a depth into region 32 that is greater than region 38. For example, region 65 may be formed underlying region 38. In the outer and central portions of region 32, region 65 has a depth from surface 29 that is substantially the same as the depth in the middle portion measured from the bottom of opening 73. In some embodiments, there may be a thin layer of an insulator, such as for example a silicon nitride or silicon dioxide insulator, on surface 29 that causes the depth of region 65 in the outer or central portion to be slightly shallower than the depth in the middle portion. However, some embodiments may include removing this insulator after the formation of insulator 37. An embodiment may include that the thickness of the insulator, thus the difference in the depth, may be in the range of a few tenths of a micron, such as for example approximately 0.05. to approximately 0.2 microns. An embodiment of region 65 may have a depth of approximately two tenths to approximately three tenths (0.2-0.3) of a micron from surface 29 in the central and outer portions of region 32, and a depth of approximately three-fourths to approximately one (0.75-1.0) micron from surface 29 in the middle portion of region 32. Region 65 may have an embodiment that may have an active doping concentration of approximately 5E15 to approximately 4E16 atoms/cm$^3$ across distance 63, or alternately approximately 1E16 to approximately 2E16 atoms/cm$^3$. The region 65 doping concentration may be substantially constant across region 32, in an embodiment. An embodiment may include that the doping concentration of region 65 is much less than the doping concentration of region 36.

A doped region 67 (illustrated by two dashed lines) may be a second of the three lateral doped regions of region 32.

Region 67 is formed near the bottom of region 32 and initially extends laterally across distance 63. In the central portion (Z4) and outer portion (Z1) of region 32, region 67 has a depth of about two and one tenth to about two and six tenths (2.1-2.6) microns from surface 29, and in the middle portion (Z2 and Z3) has depth of about two and one-half to about three and one-quarter (2.5-3.25) microns from surface 29 or alternately from the top of opening 73 or alternately approximately two tenths to approximately three tenths (0.2-0.3) microns from the bottom of region 32. Region 67 may have an embodiment that may have an active doping concentration of approximately 5E15 to approximately 4E16 atoms/cm$^3$. The region 67 doping concentration may have an embodiment that may be substantially constant across region 32. The third lateral doped region is the portion of region 32 that is positioned vertically between regions 65 and 67 and extends laterally across region 32. The third doped region has an active doping concentration that is less than that of regions 65 and 67. In an embodiment, the doping concentration of this third region may be substantially constant across region 32. An embodiment of the third lateral doped region may have an active doping concentration of approximately 5E15 to approximately 1.5E16 atoms/cm$^3$. Region 32 may, in an embodiment, be formed by a series of chain implants to obtain the various lateral doped regions and doping profiles of region 32.

The method of forming transistor 11 may include that regions 40 and 41 (illustrated by dashed lines) may be formed subsequently to forming region 32. For example, a doping type that is opposite to that of region 32 may be used to dope a part of the outer portion of region 32, a portion of the middle portion of region 32, and a portion of layer 30 adjacent to region 32. In an embodiment, regions 40 and 41 may be formed at the same time. Region 40 may be formed by counter-doping a portion of the middle portion of region 32 (for example at least a portion of zone Z2), including the portion of region 67 therein, to have an opposite conductivity type. For example, counter doping a portion of regions 32 and 67 that are underlying a portion of opening 73. Region 41 may be formed from the same operation, but positioned at a different location. Because of opening 73, the dopants form region 41 in the outer portion of region 32 (such as for example at least a portion of zone Z1) and optionally in layer 30 external to region 32. Thus, region 41 has a depth from surface 29 that is less than the depth of region 40. Regions 40 and 41 may have an embodiment that may have an active doping concentration of approximately 3E16 to approximately 1E17 atoms/cm$^3$, and may be greater than the layer 30 active doping concentration which may have an embodiment of approximately 2E14 to 3E15 atoms/cm$^3$.

Region 40 typically is formed to extend a distance vertically up from the bottom of the middle portion of region 32 toward surface 29, and to extend a lateral distance 42 from layer 30 into the middle portion of region 32. Region 40 may be formed a distance from the bottom of region 32 that is substantially the same as region 67 extends from the bottom of region 32 in zone Z3. An embodiment of region 40 may have a depth that extends approximately two and one tenth microns to approximately two and six tenths microns (2.1-2.6) from surface 29. Those skilled in the art will appreciate that in some embodiments the bottom of region 40 may extend further into layer 30 than the bottom of region 32 but should not intersect with layer 28. In other embodiments, the bottom of region 40 may be shallower than the bottom of region 32 as long as it overlaps region 67. An embodiment may include forming distance 42 to be less than approximately two microns or in some other embodiments less than approximately one micron into region 32. Because region 40 overlaps a portion of region 67, region 67 has a smaller width or lateral distance 68 across region 32 than does region 65. Distance 68 may have an embodiment that is greater than distance 42. Region 41 is positioned in the outer portion of region 32 or alternately in zone Z1. For example, positioned in at least a portion of region 32 that is not underlying opening 73. In some embodiments, region 41 may extend into adjacent portions of layer 30. Because of the counter-doping of regions 40 and 41, the outer portion of region 32, for example zone Z1, and the portion of region 32 overlying region 40, for example zone Z2, have respective depths 75 and 76 that are smaller than a depth 77 of the remainder of the middle portion of region 32, for example zone Z3. The thickness of region 32 overlying region 40 up to region 38, is thinner than region 32 that is overlying region 41. Thus, the bottom of the portion of region 32 overlying region 40 is deeper from surface 29 than the bottom of the outer portion overlying region 41. An embodiment of region 40 may also have a shallower depth than a bottom of the central portion of region 32. The central portion, or alternately zone Z4, may have an embodiment having a depth 78 that is less than depth 77 of the middle portion of region 32.

Those skilled in the art will appreciate that only two mask steps may be used to form regions 32, 40 and 41. One mask to form regions 32 and 38, and one mask to form regions 40 and 41. Using only two masks reduces the number of steps used to form the zones (described further hereinafter) thereby reducing the costs of transistor 11 and device 10. An alternate embodiment may include that region 38 may be formed after forming region 32, including regions 65 and 67. Those skilled in the art will appreciate that in other embodiments, regions 40 and 41 may be formed after forming opening 73 and prior to forming region 32. In some embodiments, region 38 may be formed after region 32, 40, and 41. Subsequently to forming regions 32, 38, 40, and 41, the insulator material of insulator 37 (FIG. 2) may be formed in opening 73.

An embodiment of the plurality of zones may include forming the zones having a shape similar to a rectangular polygon. The first zone (Z1) includes the accumulation region of region 32. In an embodiment, zone Z1 is the portion of region 32 overlying region 41, or alternately may be the portion of region 32 external to opening 73, or alternately insulator 37, and nearest to source region 50. An embodiment may include that zone Z1 is the outer portion of region 32. Zone Z1 may have a substantially rectangular polygon shape where one side is a portion of surface 29 extending laterally from opening 73, or alternately from insulator 37. Another side is the vertical interface between region 32 and layer 30 extending into layer 30 and intersecting with region 41, another side is along the bottom at the interface with the top of region 41, and the last side is from the end of region 41 vertically back to the top surface of region 32. Zone Z2 may be the portion of region 32 overlying region 40 and extending vertically from the horizontal interface of regions 32 and 40 up to the top of region 32 that is underlying opening 73, or alternately up to region 38. The third zone Z3 is the remainder of the middle portion of region 32. For example, zone Z3 may be another polygon shape with the bottom that extends laterally across region 32 from the interface between region 40 and region 32 along the bottom of region 32 and underlying the remainder of opening 73. Another side may extend up to intersect the side or edge of opening 73, or alternately insulator 37. Zone Z3 extends vertically up through region 32 to the interface with opening 73 or insulator 37, or alternately region 38. The fourth zone Z4 is the portion extending laterally from line 14 towards the portion of region 32 underlying the edge or side of opening 73, or alternately toward the edge of insulator 37. Zone Z4 has a width of distance 70 across region 32. Zone Z4 includes the drain region of transistor 11. In an embodiment, zone Z4 may be the central portion of region 32.

Figure 4:
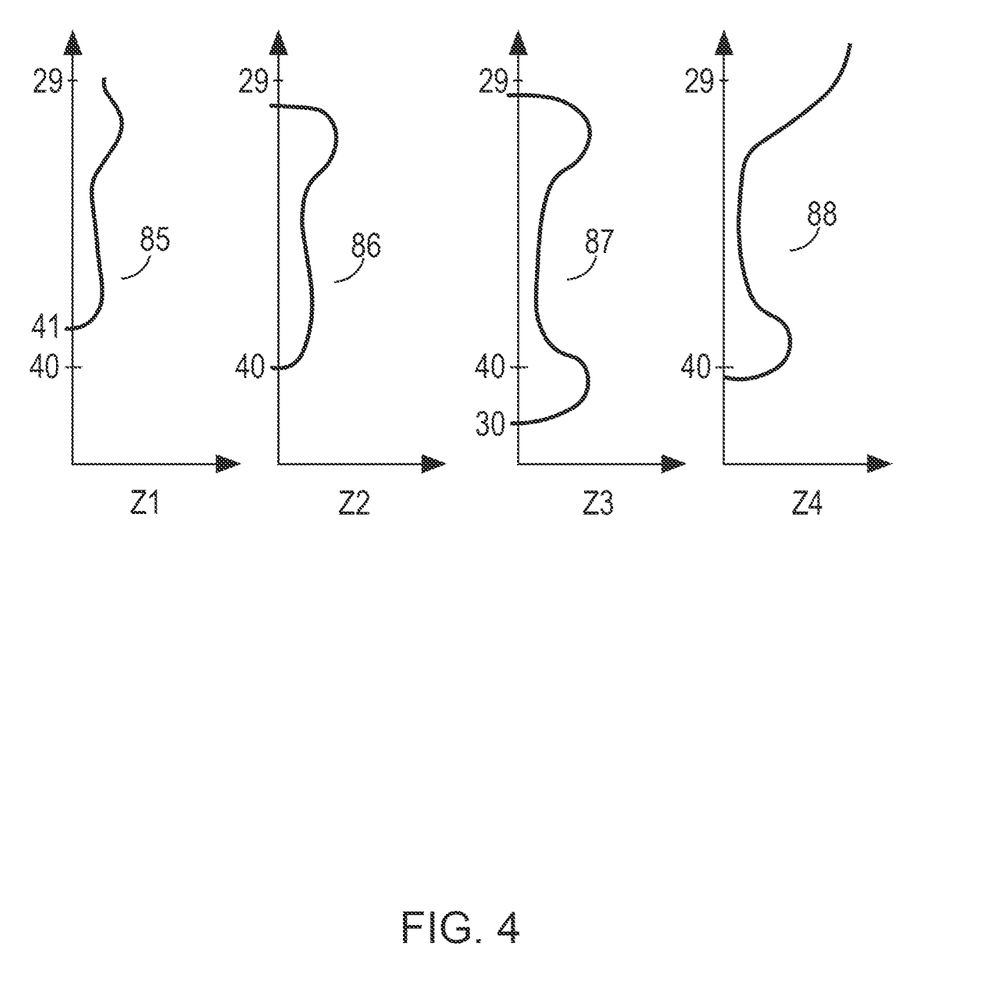
FIG. 4 is a graph of an example of an embodiment of some of the zones of the transistor of FIG. 2 in accordance with the present invention.

FIG. 4 is a graph having plots of example embodiments of the active doping concentrations and the charge formed within an example of an embodiment of zones Z1-Z4. The ordinate indicates depth from surface 29 into region 32 and the abscissa indicates increasing amount. A plot 85 illustrates in a general manner an example of an embodiment of the active doping concentration or alternately charge of the majority carriers for zone Z1. A plots 86-88 illustrates in a general manner examples of embodiments of the active doping concentration or alternately charge of the majority carriers for respective zones Z2-Z4. An embodiment may include that the majority carriers for zones Z1-Z4 is an N-type dopant, or alternately electrons. The majority carriers may be other types in other embodiments.

Region 32 is formed with each of zones Z1-Z4 having a different vertical doping profile for each zone and a different charge. For zone Z1, region 41 forms a P-N junction along the interface with the bottom of region 32. The P-N junction forms a depletion region that depletes mobile carries from the bottom of zone Z1, such as near the interface between regions 32 and 41. Consequently, zone Z1 has a charge concentration and active doping concentration that decreases vertically along the depth of zone Z1. Region 65 forms a high dopant concentration near surface 29, thus a high charge concentration. As is illustrated by plot 85, the dopant concentration and charge concentration decrease in the portion of region 32 underlying region 65, and region 41 depletes carriers from the bottom portion of zone Z1, thus the charge becomes substantially zero at region 41. The vertical doping profile and the vertical charge concentration remains substantially constant across the width of zone Z1. Thus, along a plane across zone Z1 the doping concentration and the charge concentration remains substantially constant. In zone Z2, region 40 intersects with region 67 which prevents region 67 from adding carriers in zone Z2. Region 40 forms a P-N junction with region 32 and forms a depletion region similar to region 41, which further reduces the carrier concentration. Because region 65 is deeper from surface 29 in zone Z2, the zone Z2 doping concentration and charge concentration has a different profile from the profile in zone Z1 (from surface 29). As illustrated by plots 85 and 86, there is a step change in the vertical doping profile and charge concentration between zones Z1 and Z2. Region 65 forms a high dopant concentration, thus a high charge concentration. The dopant concentration and charge concentration decrease in the portion of zone Z2 underlying region 65, and region 40 depletes carries from the bottom portion of zone Z2. The vertical doping profile and the vertical charge concentration varies through the depth underlying region 65 of zone Z2 but is substantially constant across the width of zone Z2. Thus, along a plane across zone Z2 the doping concentration and the charge concentration remains substantially constant.

Zone Z3 includes region 67 so that Z3 has more carriers that Z2. As illustrated by plot 87, zone Z3 has a vertical doping profile that has a first peak near the top of region 32 (for example near the bottom of opening 73, or alternately insulator 37, or alternately region 38), and has a second peak doping concentration or charge concentration near the bottom of region 32, for example along region 67. There is a P-N junction along the interface between the bottom of region 32 and layer 30. However, because layer 30 has a lower doping concentration than regions 40 and 41, the associated depletion region is narrower than the one formed by regions 40 and 41. Consequently, the vertical doping profile and vertical carrier charge density in zone Z3 has a peak along region 65, decreases in the portion of region 32 between regions 65 and 67, and increases again in region 67. Thus, there is a substantial step change in the vertical doping profile and the charge concentration between zones Z2 and Z3.

Zone Z4 has a larger average charge concentration or larger active doping concentration than does zone Z3. Zone Z4 also has a first peak concentration near the surface of zone Z4 and a second peak concentration close to the bottom of zone Z4, as is illustrated by plot 88. Thus, region 32 is formed with four charge zones that each have different active doping concentration or different charge concentration or doping profiles from the adjacent zone. The charge concentration formed by the four zones in region 32 assists in providing a uniform distribution of electric field between source region 50 and the drain of transistor 11 resulting in an improved breakdown voltage for transistor 11.

An embodiment may include a substantially step change in the charge concentration or active doping concentration at the boundary between each zone, as illustrated in a general manner by plots 85-88. For example, a lateral plane across the boundary of any two adjacent zones will have such a step change. An embodiment may include a substantially step increase of charge concentration in Z2 at the interface of zones Z1-Z2, a substantially step increase of charge concentration in Z3 at the interface of zones Z2-Z3, and a substantially step increase of charge concentration in Z4 at the interface of zones Z3-Z4. In an embodiment, zone Z2 may be approximately five to approximately thirty percent (5%-30%) greater than Z1, zone Z3 may be approximately five to approximately fifty percent (5%-50%) greater than Z2, and zone Z4 may be approximately twenty percent to approximately five hundred percent (20%-500%) greater than Z3. An embodiment may include that the charge concentration or active doping concentration is substantially constant within each zone and substantially does not vary across the width of the zone.

From all the foregoing, one skilled in the art will appreciate that an example of an embodiment of a semiconductor device having a transistor may comprise:

a semiconductor substrate, such as for example substrate 25;

an insulator, such as for example insulator 27, on the semiconductor substrate;

an epitaxial layer, such as for example one of layers 27 or 28 or 30, of a first conductivity type and a first active doping concentration, such as for example P-type, formed on the insulator, the epitaxial layer having a surface, such as for example surface 29, that is opposite to the insulator;

a source region, such as for example region 25, of a second conductivity type, such as for example N-type, within the epitaxial layer;

a channel region, such as for example region 47 or adjacent region 30, adjacent the source region;

a drift region, such as for example region 32, of the second conductivity type formed within the epitaxial layer, the drift region extending laterally to the channel region and having a notch, such as for example the notch near 73 or 37, extending a first distance from the surface of the epitaxial layer into the drift region, the notch having a bottom surface extending laterally across the notch;

an accumulation region, such as for example Z1, of the second conductivity type formed as a first zone of the drift region adjacent to a first edge of the notch, the accumulation region having a first width and extending a first depth, such as for example 75, into the drift region and having a first bottom, the first zone having a second active doping concentration of the second conductivity type adjacent the surface, and a third active doping concentration extending vertically from the second active doping concentration to the first bottom wherein the third active doping concentration is substantially constant and is lower than the second active doping concentration;

a first counter-doped region, such as for example region 41, abutting the first bottom and positioned between the first bottom and the epitaxial layer, the first counter-doped region having the first conductivity type and a fourth active doping concentration that is greater than the first active doping concentration wherein a first P-N junction is formed along an interface with the first bottom;

a second zone, such as for example zone Z2, of the drift region formed underlying a first portion of the notch and abutting the first zone, the second zone having a second width extending laterally across the drift region from under the first edge of the notch and extending a second depth, such as for example depth 76, from the bottom surface of the notch into the drift region wherein the second zone has a second bottom, the second zone having substantially the second active doping concentration of the second conductivity type a first distance from the bottom surface of the notch, and substantially the third active doping concentration extending vertically from the first distance to the second bottom;

a second counter-doped region, such as for example region 40, abutting the second bottom and positioned between the second bottom and the epitaxial layer, the second counter-doped region having the first conductivity type and substantially the fourth active doping concentration wherein a second P-N junction is formed along an interface with the second bottom;

a third zone, such as for example zone Z3, of the drift region formed abutting the second zone and underlying a second portion of the notch that is adjacent to the first portion of the notch, the third zone extending laterally across the drift region a third width from the second zone and a third depth, such as for example depth 77, from the bottom surface of the notch into the drift region wherein the third depth is greater than the second depth, the third zone having a third bottom abutting a portion of the epitaxial layer, the third zone having substantially the second active doping concentration of the second conductivity type substantially the first distance from the bottom surface of the notch, a fifth active doping concentration extending a second distance from the third bottom toward the bottom surface of the notch wherein the fifth active doping concentration is substantially the same as the second active doping concentration, the third zone having substantially the third active doping concentration of the second conductivity type within the third zone that is positioned deeper than the third depth and more than the second distance from the third bottom; and a fourth zone, such as for example zone Z4, of the drift region formed within the drift region adjacent to a second edge of the notch and extending laterally a fourth width across the drift region and extending a fourth depth, such as for depth 78, into the drift region wherein the fourth depth is less than the third depth, the fourth zone having a fourth bottom abutting the epitaxial layer, the fourth zone having substantially the second active doping concentration of the second conductivity type a third distance from the surface of the epitaxial layer, having substantially the fourth active doping concentration extending substantially the second distance from the fourth bottom toward the surface of the epitaxial layer, the fourth zone having substantially the third active doping concentration of the second conductivity type within the fourth zone that is positioned deeper than the third depth and more than the second distance from the fourth bottom.

In an embodiment, the fourth zone includes a drain region positioned adjacent to the second edge of the notch and extending into the drift region.

An embodiment may include that the first width is less than the second width and less than a width of the notch, such as for example opening 73.

In an embodiment the second width may be less than the third width and less than the width of the notch.

Another embodiment may include that the fourth width is less than the third width and less than the width of the notch.

In an embodiment the notch has a width that is less than a width of the drift region.

An embodiment may include that the first counter-doped region extends at least the first width into the first zone.

An embodiment of the transistor may include that the second counter-doped region extends at least the second width into the second zone.

In an embodiment the second bottom of the second zone may be deeper from the surface of the epitaxial layer than the first depth of the first zone.

Another embodiment may include that the first edge of the notch may be closer to the source region that the second edge of the notch.

An embodiment may include a top region of the first conductivity type having a fifth active doping concentration, overlying the second zone and the third zone, the top region positioned between the bottom surface of the notch and the second zone and the third zone.

Those skilled in the art will appreciate that an embodiment of a method of forming a semiconductor device may comprise:

forming a first doped region, such as for example region 30, of a first conductivity type, such as for example P-type, having a first active doping concentration, the first doped region having a first surface, such as for example surface 29, and a first depth, such as for example greater than 77;

forming a drift region, such as for example region 32, of a second conductivity type, such as for example N-type, within the first doped region, the drift region having a first lateral distance, such as for distance 63, across the first doped region;

forming within the drift region a second doped region, such as for example region 65, of the second conductivity type and having a second active doping concentration, positioning the second doped region a second depth from the first surface in a first portion of the drift region, such as for example zone Z1, positioned a third depth from the first surface in a second portion of the drift region that is adjacent to the first portion of the drift region, and positioned substantially the third depth in a third portion of the drift region wherein the second portion of the drift region is in-between the first portion and the third portion; and forming within the drift region a third doped region, such as for example region 67, of the second conductivity type and a third active doping concentration, positioning the third doped region a third depth from the first surface in the third portion of the drift region, wherein the third doped region is substantially not in the first portion of the drift region and substantially not in the second portion of the drift region, wherein the third depth is greater than the second depth and wherein the drift region has a fourth active doping concentration extending from the second doped region to the third doped region wherein the fourth active doping concentration is less than the second active doping concentration and less than the third active doping concentration.

The method may have an embodiment that may include forming the third active doping concentration to be substantially the same as the second active doping concentration.

An embodiment may include forming an opening, such as for example opening 73, extending into the drift region and overlying the second portion of the drift region and the third portion of the drift region but not overlying the first portion of the drift region wherein the second doped region that is within second portion of the drift region and the third portion of the drift region underlies the opening.

An embodiment may include forming a fourth doped region, such as for example region 38, of the first conductivity type and a fourth active doping concentration, forming the fourth doped region in the second portion of the drift region and the third portion of the drift region and overlying the second doped region.

Another embodiment may include forming a fourth doped region, such as for example region 40, of the first conductivity type and a fourth active doping concentration within the second portion of the drift region and positioned substantially the third depth from the first surface.

Those skilled in the art will appreciate that an example of an embodiment of a semiconductor device having a transistor may comprise:

a doped region, such as for example region 30, of a first conductivity type, such as for example P-type, and a first active doping concentration overlying a semiconductor substrate, such as for example substrate 25;

a drift region, such as for example region 32, of the transistor formed adjacent to a channel region, the drift region having a second conductivity type, such as for example N-type, and a plurality of zones extending vertically into the drift region wherein each zone of the plurality of zones has a width laterally across the drift region;

a first zone, such as for example one or more of zones Z1 or Z2, of the plurality of zones with having a first peak active doping concentration near a top surface and having a second active doping concentration extending from the first peak active doping concentration to a bottom of the first zone wherein the second active doping concentration is less than the first peak active doping concentration and wherein the second active doping concentration is substantially constant throughout the first zone; and two adjacent zones of the plurality of zones having substantially the first peak active doping concentration near a top surface of each of the two adjacent zones, and having a second peak active doping concentration a first distance from a bottom of a corresponding zone of the two adjacent zones, each of the two adjacent zones having substantially the second active doping concentration extending from the first peak active doping concentration to the second peak active doping concentration.

The semiconductor device may have an embodiment wherein each zone of the plurality of zones has a width laterally across the drift region that is no less than approximately ten percent of a width, such as for example distance 63, of the drift region, a drain, such as for example one or more of regions 35 or 36 or Z4, of the transistor positioned within the drift region.

An embodiment may include that the first zone has a first P-N junction along a first bottom of the first zone, the first P-N junction having a first depletion width; and a second zone of the two adjacent zones having a second P-N junction along a second bottom of the second zone, the second P-N junction having a second depletion width that is less than the first depletion width.

Another embodiment may include that the first bottom of the first zone has a first depth from a surface of the doped region; and a third zone, such as for example zone Z2, abutting the first zone and having a third bottom positioned a second depth, such as for example one or more of depths 76 or 73, from the surface of the doped region wherein the second depth is greater than the first depth, a third P-N junction along the third bottom wherein the third P-N junction has substantially the first depletion width.

In view of all of the above, it is evident that a novel device and method is disclosed. Included, among other features, is forming a drift region to have a plurality of distinct charge zones where the value of the charge changes between the zones. A method of forming the distinct region uses fewer processing steps than other methods which reduces the cost of the resulting device. Forming a carrier adjust region (for example regions 40 and/or 41) to counter dope a portion of the drift region assists in providing a substantially uniform electric field in the drift region. Also, region 65 provides a large carrier charge in the accumulation region which assist in reducing the on-resistance.

By having the higher doped region 67, the carrier adjust regions become more effective because it creates a larger difference between adjacent zones without having to have too much overlap between region 40 and region 67 in the vertical direction, which helps reducing the on-resistance (by preserving a wider conduction path). The heavier doped region 67 also contributes to the conduction especially in zone 3, which usually has the longest length. Region 67 assists in forming a large differential in concentration between zone 2 and zone 3.

While the subject matter of the descriptions is described with specific preferred embodiments and example embodiments, the foregoing drawings and descriptions thereof depict only typical and non-limiting examples of embodiments of the subject matter and are not therefore to be considered to be limiting of its scope, it is evident that many alternatives and variations will be apparent to those skilled in the art. As will be appreciated by those skilled in the art, although the descriptions use the example of an N-channel transistor, the descriptions also apply to forming a P-channel transistor. For example, by changing the appropriate conductivity types.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A semiconductor device having a transistor comprising:
   a semiconductor substrate;
   an insulator on the semiconductor substrate;
   an epitaxial layer of a first conductivity type and a first active doping concentration formed on the insulator, the epitaxial layer having a surface that is opposite to the insulator;
   a source region of a second conductivity type within the epitaxial layer;
   a channel region adjacent the source region;
   a drift region of the second conductivity type formed within the epitaxial layer, the drift region extending laterally to the channel region and having a notch extending a first distance from the surface of the epitaxial layer into the drift region, the notch having a bottom surface extending laterally across the notch;
   an accumulation region of the second conductivity type formed as a first zone of the drift region adjacent to a first edge of the notch, the accumulation region having a first width and extending a first depth into the drift region and having a first bottom, the first zone having a second active doping concentration of the second conductivity type adjacent the surface, and a third active doping concentration extending vertically from the second active doping concentration to the first bottom wherein the third active doping concentration is substantially constant and is lower than the second active doping concentration;
   a first counter-doped region abutting the first bottom and positioned between the first bottom and the epitaxial layer, the first counter-doped region having the first conductivity type and a fourth active doping concentration that is greater than the first active doping concentration wherein a first P-N junction is formed along an interface with the first bottom;
   a second zone of the drift region formed underlying a first portion of the notch and abutting the first zone, the second zone having a second width extending laterally across the drift region from under the first edge of the notch and extending a second depth from the bottom surface of the notch into the drift region wherein the second depth is greater than the first depth and wherein the second zone has a second bottom, the second zone having substantially the second active doping concentration of the second conductivity type a first distance from the bottom surface of the notch, and substantially the third active doping concentration extending vertically from the first distance to the second bottom;
   a second counter-doped region abutting the second bottom and positioned between the second bottom and the epitaxial layer, the second counter-doped region having the first conductivity type and substantially the fourth active doping concentration wherein a second P-N junction is formed along an interface with the second bottom;
   a third zone of the drift region formed abutting the second zone and underlying a second portion of the notch that is adjacent to the first portion of the notch, the third zone extending laterally across the drift region a third width from the second zone and a third depth from the bottom surface of the notch into the drift region wherein the third depth is greater than the second depth, the third zone having a third bottom abutting a portion of the epitaxial layer, the third zone having substantially the second active doping concentration of the second conductivity type substantially the first distance from the bottom surface of the notch, a fifth active doping concentration extending a second distance from the third bottom toward the bottom surface of the notch wherein the fifth active doping concentration is substantially the same as the second active doping concentration, the third zone having substantially the third active doping concentration of the second conductivity type within the third zone that is positioned deeper than the third depth and more than the second distance from the third bottom; and
   a fourth zone of the drift region formed within the drift region adjacent to a second edge of the notch and extending laterally a fourth width across the drift region and extending a fourth depth into the drift region, the fourth zone having a fourth bottom at the fourth depth wherein the fourth bottom abuts the epitaxial layer and wherein the fourth depth is less than the third depth, the fourth zone abutting the third zone at an interface with the third zone wherein the interface extends toward the notch from the fourth depth past the second depth, the fourth zone having substantially the second active doping concentration of the second conductivity type a third distance from the surface of the epitaxial layer, having substantially the fourth active doping concentration extending substantially the second distance from the fourth bottom toward the surface of the epitaxial layer, the fourth zone having substantially the third active doping concentration of the second conductivity type within the fourth zone that is positioned deeper than the third depth and more than the second distance from the fourth bottom.

2. The semiconductor device of claim 1 wherein the fourth zone includes a drain region positioned adjacent to the second edge of the notch and extending into the drift region.

3. The semiconductor device of claim 1 wherein the first width is less than the second width and less than a width of the notch.

4. The semiconductor device of claim 3 wherein the second width is less than the third width and less than the width of the notch.

5. The semiconductor device of claim 4 wherein the fourth width is less than the third width and less than the width of the notch.

6. The semiconductor device of claim 1 wherein the notch has a width that is less than a width of the drift region.

7. The semiconductor device of claim 1 wherein the first counter-doped region extends at least the first width into the first zone.

8. The semiconductor device of claim 1 wherein the second counter-doped region extends at least the second width into the second zone.

9. The semiconductor device of claim 1 wherein the first edge of the notch is closer to the source region that the second edge of the notch.

10. The semiconductor device of claim 1 further including a top region of the first conductivity type having a sixth active doping concentration, the top region overlying the second zone and the third zone, the top region positioned between the bottom surface of the notch and the second zone and the third zone.

11. A semiconductor device having a transistor comprising:
a doped region of a first conductivity type and a first active doping concentration overlying a semiconductor substrate;
a drift region of the transistor within the doped region and adjacent to a channel region wherein the channel region is within the doped region, the drift region having a second conductivity type and a plurality of zones extending vertically into the drift region wherein each zone of the plurality of zones has a width laterally across the drift region;
a first zone of the plurality of zones having a first peak active doping concentration of the second conductivity type near a top surface and having a second active doping concentration of the second conductivity type extending from the first peak active doping concentration to substantially a bottom of the first zone wherein the second active doping concentration is less than the first peak active doping concentration and wherein the second active doping concentration is substantially constant laterally across the first zone; and
two adjacent zones of the plurality of zones having substantially the first peak active doping concentration of the second conductivity type near a top surface of each of the two adjacent zones, and having a second peak active doping concentration of the second conductivity type a first distance from a bottom of a corresponding zone of the two adjacent zones, each of the two adjacent zones having substantially the second active doping concentration of the second conductivity type extending from the first peak active doping concentration to the second peak active doping concentration wherein the second peak active doping concentration is greater than the second active doping concentration.

12. The semiconductor device of claim 11 wherein each zone of the plurality of zones has a width laterally across the drift region that is no less than approximately ten percent of a width of the drift region, a drain of the transistor positioned within the drift region.

13. The semiconductor device of claim 11 further including the first zone having a first P-N junction along a first bottom of the first zone wherein the first P-N junction is between a portion of the first bottom and a region underlying the portion, the first P-N junction having a first depletion width; and
a second zone of the two adjacent zones having a second P-N junction along a second bottom of the second zone, the second P-N junction having a second depletion width that is less than the first depletion width.

14. The semiconductor device of claim 13 further including the first bottom of the first zone having a first depth from a surface of the doped region; and
a third zone abutting the first zone and having a third bottom positioned a second depth from the surface of the doped region wherein the second depth is greater than the first depth, a third P-N junction along the third bottom wherein the third P-N junction has substantially the first depletion width.

15. A semiconductor device comprising:
a first doped region of a first conductivity type having a first active doping concentration, the first doped region having a first surface and a first depth;
a drift region of a second conductivity type disposed within the first doped region, the drift region having a first lateral distance across the first doped region;
a second doped region of the second conductivity type disposed within the drift region and having a second active doping concentration, the second doped region having a second depth from the first surface in a first portion of the drift region, the second doped region having a third depth from the first surface in a second portion of the drift region that is adjacent to the first portion of the drift region, and the second doped region having substantially the third depth in a third portion of the drift region wherein the third depth is greater than the second depth and wherein the second portion of the drift region is in-between the first portion of the drift region and the third portion of the drift region;
a third doped region having a third active doping concentration of the second conductivity type, the third doped region disposed within the drift region and underlying at least a portion of the second doped region, the third doped region having a fourth depth from the first surface in the third portion of the drift region, wherein the third doped region is substantially not in the first portion of the drift region and substantially not in the second portion of the drift region and wherein the fourth depth is greater than the third depth; and
the drift region of the second conductivity type having a fourth active doping concentration extending substantially from the second doped region to substantially the third doped region wherein the fourth active doping concentration is less than the second active doping concentration and less than the third active doping concentration.

16. The semiconductor device of claim 15 wherein the third active doping concentration is substantially the same as the second active doping concentration.

17. The semiconductor device of claim 15 further including an opening extending into the drift region, the opening overlying the second portion of the drift region and the third portion of the drift region but not overlying the first portion of the drift region wherein the second doped region that is within both second portion of the drift region and the third portion of the drift region underlies the opening.

18. The semiconductor device of claim 15 further including a fourth doped region of the first conductivity type and a fifth active doping concentration, the fourth doped region overlying the second doped region in both the second portion of the drift region and the third portion of the drift region.

19. The semiconductor device of claim 15 further including a fourth doped region of the first conductivity type and a fifth active doping concentration, the fourth doped region disposed within at least a portion of the second portion of the drift region and positioned substantially the third depth from the first surface.

20. The semiconductor device of claim 11 further including a substantial step change in charge concentration laterally between the two adjacent zones at a boundary between the two adjacent zones.

* * * * *